(12) United States Patent
Yoshimura et al.

(10) Patent No.: US 12,152,299 B2
(45) Date of Patent: Nov. 26, 2024

(54) VACUUM PROCESSING DEVICE

(71) Applicant: IHI Corporation, Tokyo (JP)

(72) Inventors: Akihiko Yoshimura, Tokyo (JP);
Naoya Yamamoto, Tokyo (JP);
Hirotsugu Chishina, Tokyo (JP);
Wataru Ueda, Tokyo (JP)

(73) Assignee: IHI Corporation, Tokyo (JP)

( * ) Notice: Subject to any disclaimer, the term of this patent is extended or adjusted under 35 U.S.C. 154(b) by 598 days.

(21) Appl. No.: 17/476,079

(22) Filed: Sep. 15, 2021

(65) Prior Publication Data

US 2022/0002862 A1     Jan. 6, 2022

Related U.S. Application Data

(63) Continuation of application No. PCT/JP2019/049523, filed on Dec. 18, 2019.

(30) Foreign Application Priority Data

Mar. 28, 2019   (JP) .................................. 2019-062719

(51) Int. Cl.
*C23C 14/56*         (2006.01)
*C23C 16/54*         (2006.01)
(Continued)

(52) U.S. Cl.
CPC .............. *C23C 14/56* (2013.01); *C23C 16/54* (2013.01); *C23C 16/545* (2013.01); *D06M 11/74* (2013.01); *D06M 11/81* (2013.01)

(58) Field of Classification Search
None
See application file for complete search history.

(56) References Cited

U.S. PATENT DOCUMENTS 3,994,058 A * 11/1976 Sasaki .................... B65H 65/00
                                                      242/476.1
4,142,008 A *  2/1979 DeBolt .................. D01F 11/124
                                                      427/112
(Continued)

FOREIGN PATENT DOCUMENTS

JP           6-37384 U       5/1994
JP           6-172033 A      6/1994
(Continued)

OTHER PUBLICATIONS

English Machine translation of Toriyama (JP11100167A) retrieved from ESPACENET Mar. 15, 2024 (Year: 2024).*

(Continued)

*Primary Examiner* — Ram N Kackar
*Assistant Examiner* — Laureen Chan
(74) *Attorney, Agent, or Firm* — Oblon, McClelland, Maier & Neustadt, L.L.P.

(57) ABSTRACT

A device of executing vacuum processing is provided with: a chamber including a single main chamber executing the vacuum processing and being capable of keeping the chamber in a depressurized state; a feeding roller so disposed as to hang down a reinforcement fiber in the main chamber; a winding bobbin winding the reinforcement fiber, the winding bobbin disposed in the chamber horizontally apart from the reinforcement fiber vertically hung down; and a swing body pivotally supported in the chamber to swing about a pivot and including a suspension arm capable of capturing and suspending the reinforcement fiber according to a swing motion of the swing body, the suspension arm is capable of swinging from a first position horizontally apart from the reinforcement fiber vertically hung down, via a second position for capturing the reinforcement fiber, to a third (Continued)

position to suspend the reinforcement fiber above the winding bobbin.

5 Claims, 4 Drawing Sheets

(51) Int. Cl.
*D06M 11/74* (2006.01)
*D06M 11/81* (2006.01)

(56) References Cited

U.S. PATENT DOCUMENTS

| | | | | |
|---|---|---|---|---|
| 4,343,836 | A | * 8/1982 | Newkirk | C23C 16/14 |
| | | | | 427/295 |
| 2011/0240225 | A1 | * 10/2011 | Yamada | B65H 23/038 |
| | | | | 118/500 |
| 2015/0218692 | A1 | * 8/2015 | Nakada | C23C 16/545 |
| | | | | 427/177 |
| 2016/0333466 | A1 | 11/2016 | Nakada et al. | |
| 2017/0022606 | A1 | 1/2017 | Nakada et al. | |

FOREIGN PATENT DOCUMENTS

| | | | | |
|---|---|---|---|---|
| JP | 7-197264 | A | | 8/1995 |
| JP | 11100167 | A | * | 4/1999 |
| JP | 2011-157632 | A | | 8/2011 |
| JP | 2014-80307 | A | | 5/2014 |
| JP | 2015-203129 | A | | 11/2015 |

OTHER PUBLICATIONS

Merriam-Webster dictionary definition of "funnel" retrieved from https://www.merriam-webster.com/dictionary/funnel on Apr. 18, 2024 (Year: 2024).*

International Search Report issued Jan. 28, 2020 in PCT/JP2019/049523, filed on Dec. 18, 2019 citing documents AA-AB, AO-AS therein, 4 pages.

* cited by examiner

VACUUM PROCESSING DEVICE

CROSS-REFERENCE TO RELATED APPLICATIONS

This application is a Continuation Application of PCT No. PCT/JP2019/049523 (filed International Application Dec. 18, 2019), which is in turn based upon and claims the benefit of priority from Japanese Patent Application No. 2019-062719 (filed Mar. 28, 2019), the entire contents of which are incorporated herein by reference.

BACKGROUND

Technical Field

The disclosure herein relates to a vacuum processing device available for a process of forming a coating on a reinforcement fiber, and in particular relates to a vacuum processing device in which a bobbin can be exchanged while the most part of the device is kept evacuated.

Description of the Related Art

Ceramic matrix composites (CMC) are articles in which reinforcement fibers of ceramics are combined by matrices of ceramics. The SiC/SiC composite for example, in which reinforcement fibers of silicon carbide are combined by a matrix of silicon carbide, shows promise for the application as turbine components or such of jet engines.

A coating such as that of boron nitride is sometimes applied to silicon carbide fibers in order to strengthen binding force to its matrices. A vacuum processing is applicable to formation of the coating although it is no more than an example. A reaction chamber is often required to be very long so as to assure sufficient residence time therein in light of an enough reaction time, and accordingly a vacuum pump must be kept to run for a considerably long time in order to get a sufficient degree of vacuum throughout the chamber.

On the other hand, the reaction chamber must be exposed to the atmosphere before and after the processing so that a series of operations to load new fibers into the chamber, make them pass through the reaction chamber, and connect them to winding bobbins. The interior of the reaction chamber after being exposed to the atmosphere would absorb gas molecules and thus a very long time might be necessary to reach a sufficient degree of vacuum again.

Therefore treatments before and after the processing must require a very long time (all night and all day for example), even though the processing by itself might only require a comparatively short time. Such a vacuum processing consequently has a limited productivity. If the time for exposing the interior of the coating device to the atmosphere could be shortened, the productivity could be prominently improved.

Some arts have been proposed to enable execution of operation of connecting fibers to winding bobbins under vacuum, thereby enabling exchange of bobbins without exposing reaction chambers to the atmosphere. Related arts are disclosed in Japanese Patent Application Laid-open No. H07-197264, Japanese Patent Application Laid-open No. 2011-157632, and Japanese Patent Application Laid-open No. 2015-203129

SUMMARY

Simultaneous vacuum processing on a plurality of threads of reinforcement fibers would, if possible, further improve productivity prominently. Under vacuum, more specifically in a circumstance where any manual process is unavailable, it is uneasy to pass reinforcement fibers through such an elongated reaction chamber and successfully deliver them to a winding bobbin beyond the chamber. To simultaneously handle a plurality of threads of reinforcement fibers is, as a matter of course, more difficult. While reinforcement fibers would be readily fuzzed, such fuzz frequently touches many sites on the interior of the device or fuzz on other reinforcement fibers to change trajectories of the reinforcement fibers. This further complicates simultaneous handling of a plurality of reinforcement fibers. The device described below has been created in view of these problems.

According to an aspect, a device of executing vacuum processing on a reinforcement fiber is provided with: a chamber including a single main chamber executing the vacuum processing and being capable of keeping the chamber as a whole in a depressurized state; a feeding roller so disposed as to hang down the reinforcement fiber in the main chamber; a winding bobbin winding the reinforcement fiber, the winding bobbin disposed in the chamber horizontally apart from the reinforcement fiber vertically hung down; and a swing body pivotally supported in the chamber to swing about a pivot and including a suspension arm capable of capturing and suspending the reinforcement fiber according to a swing motion of the swing body, the suspension arm is capable of swinging from a first position horizontally apart from the reinforcement fiber vertically hung down, via a second position for capturing the reinforcement fiber, to a third position to suspend the reinforcement fiber above the winding bobbin.

Advantageous Effects

It is enabled to guide a plurality of fibers to a plurality of bobbins and start winding them with keeping a device as a whole in a depressurized state.

DESCRIPTION OF EMBODIMENTS

Exemplary embodiments will be described hereinafter with reference to the appended drawings. It is particularly noted that these drawings are not always drawn to scale exactly and therefore dimensional relations among elements are not limited to those shown therein.

Figure 1:
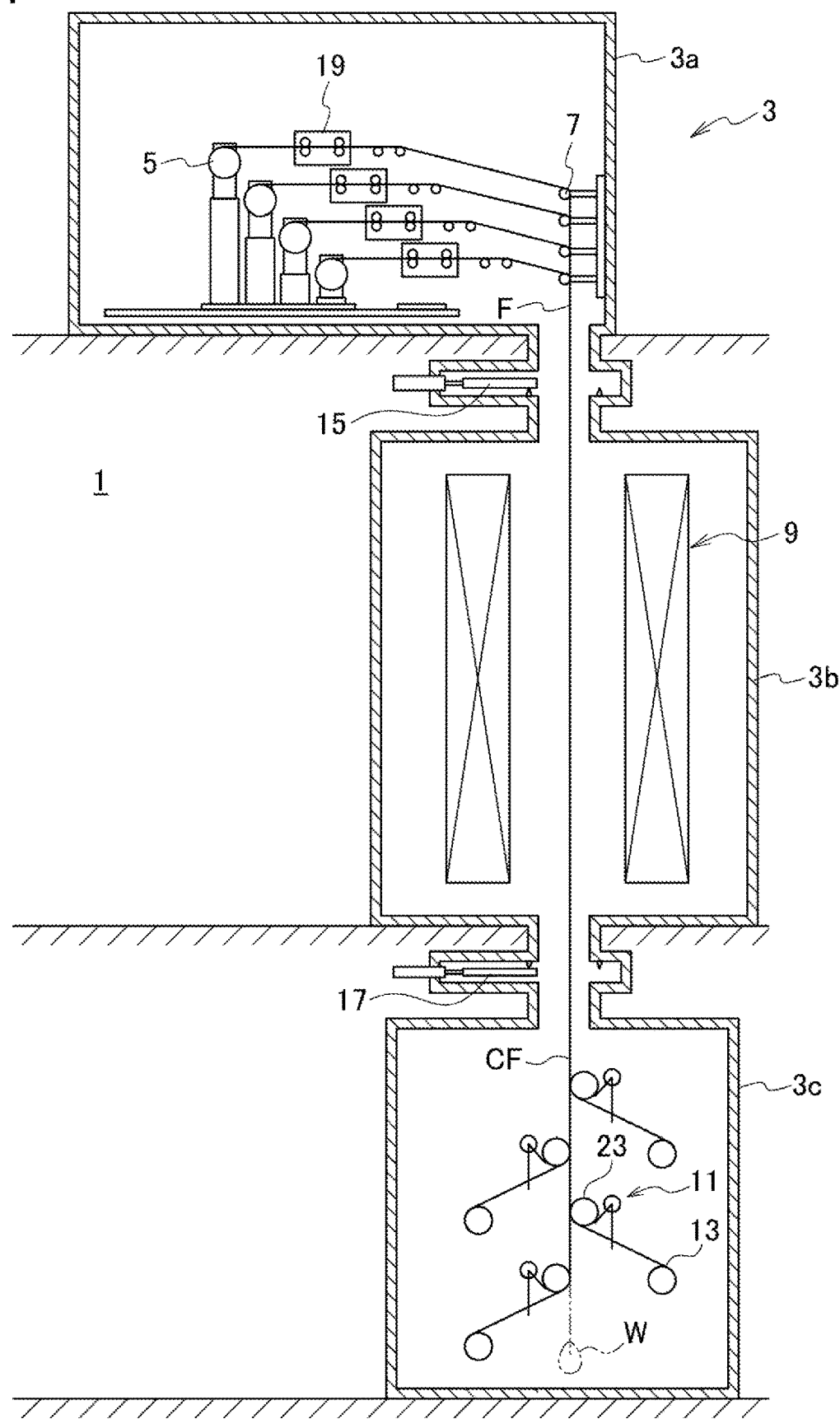
FIG. 1 is a schematic sectional view of a vacuum processing device in accordance with an embodiment.

Referring to FIG. 1, a vacuum processing device 1 of the present embodiment is available for use in formation of a coating on reinforcement fibers F by a process that uses vacuum, such as CVD or PVD for example. Examples of the reinforcement fibers are those of silicon carbide, graphite or alumina and examples of the coating are those of boron nitride or carbon but these examples are not exhaustive and limiting. The present embodiment could be used for vacuum processing on a single fiber or a yarn, a tow, a band or a fabrics in which a plurality of fibers are bundled, or yet a plurality of threads thereof.

The vacuum processing device 1 is generally composed of a chamber 3, one or more feeding bobbins 5 for feeding reinforcement fibers F, one or more feeding rollers 7 for respectively hanging down one or more threads of reinforcement fibers F fed therefrom, a processing device 9 for executing processing such as CVD, one or more sets of swing bodies 11 and pulleys 23 which respectively guide one or more threads of reinforcement fibers CF after passing through the processor 9, and one or more winding bobbins 13 for respectively winding up the one or more guided threads of reinforcement fibers CF. Although details will be described later, by the plural sets of the feeding bobbins 5, the feeding rollers 7, the pulleys 23 and the winding bobbins 13, the plural threads of the reinforcement fibers F are made to pass through the single processor 9 simultaneously and in parallel, thereby executing vacuum processing.

The chamber 3 is a vacuum chamber that can keep itself as a whole in a depressurized state. The chamber 3 is further sectioned into a plurality of sub-chambers. In the example shown in the drawing, the chamber 3 is comprised of a first sub-chamber 3a housing the feeding bobbins 5 and the feeding rollers 7, a single main chamber 3b housing the processor 9, and a second sub-chamber 3c housing the swing bodies 11 and the winding bobbins 13 and such, and these chambers are in communication with each other. The chamber 3 may have other sub-chambers if necessary.

One or more vacuum pumps not shown are connected to the chamber 3 in order to set the interior of the chamber 3 in a depressurized state. Although the vacuum pumps are connected at least to the first sub-chamber 3a, independent vacuum pumps may be further connected to the main chamber 3b and the second sub-chamber 3c, respectively. Additional vacuum pumps may be connected to additional sub-chambers if they exist.

The first sub-chamber 3a, the main chamber 3b and the second sub-chamber 3c take a form of being piled up vertically in order to hang the reinforcement fibers F vertically down and pass them through the processor 9. Further the main chamber 3b may be vertically elongated in order to ensure a sufficient reaction time in the processor 9. Therefore these elements may take a form in that the second sub-chamber 3c is installed on a first floor in a building, the main chamber 3b on a second floor, and the first sub-chamber 3a on any still upper floor, for example.

At least in between the first sub-chamber 3a and the main chamber 3b and in between the main chamber 3b and the second sub-chamber 3c, gates 15, 17 for gas-tightly separating them may be interposed. To the gate 15, 17 applicable are gate-valves but still applicable are any other types of valves, such as pendulum valves or butterfly valves. Preferably actuators such as hydraulic cylinders are respectively connected thereto for driving the gates 15, 17.

Between the first sub-chamber 3a and the main chamber 3b and between the main chamber 3b and the second sub-chamber 3c, gas-tight communication be may established through communication paths respectively. The gates 15, 17 may be provided in these communication paths.

The feeding bobbins 5 are housed in the first sub-chamber 3a and actuators such as motors are respectively connected thereto for these rotation. When closing the gate 15, as the first sub-chamber 3a is gas-tightly separated from the main chamber 3b, the first sub-chamber 3a is allowed to be exposed to the atmosphere with keeping the main chamber 3b evacuated, thereby allowing carry-in or exchange of the feeding bobbins 5.

In the first sub-chamber 3a, still another device such as tension detectors 19 may be installed. The tension detectors 19 are used for the purpose of detecting tension acting on the reinforcement fibers F being fed out.

Figure 2:
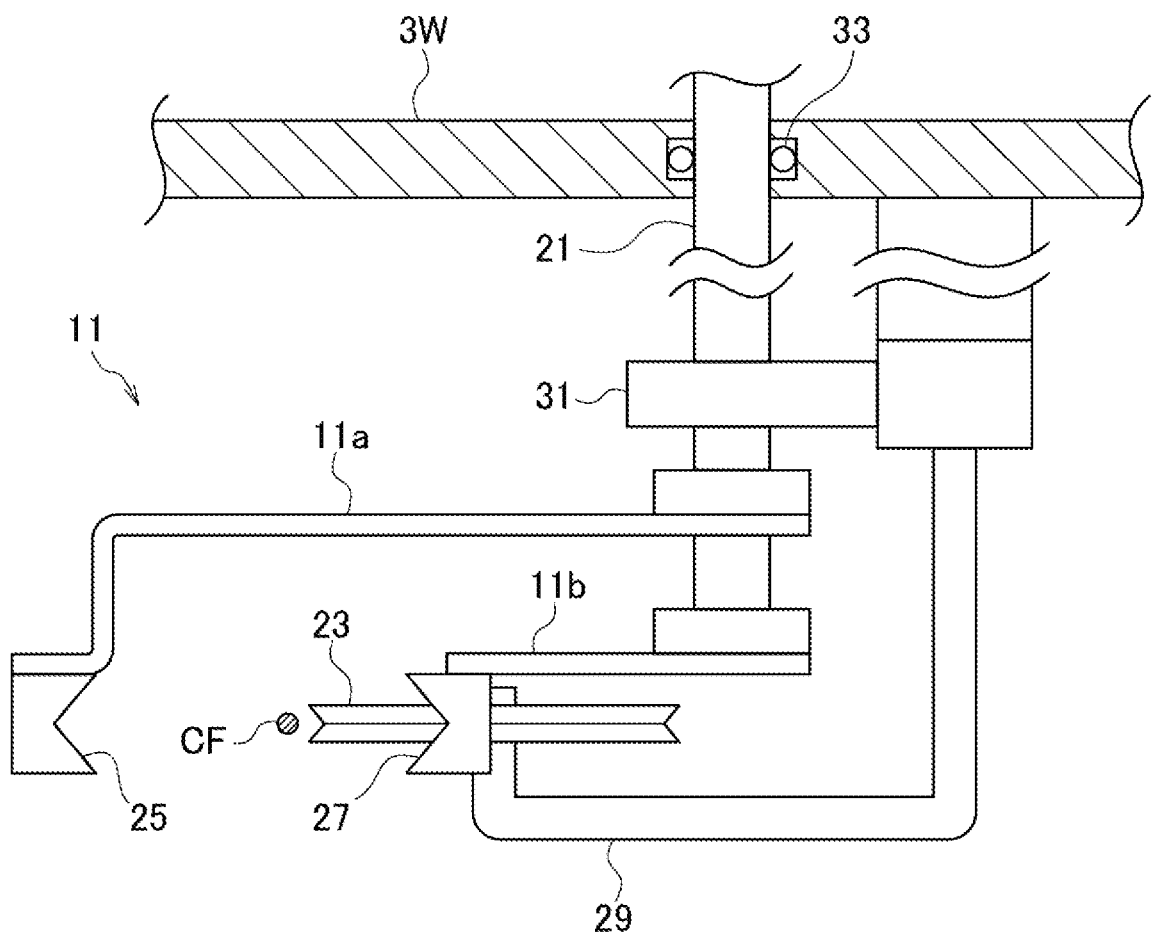
FIG. 2 is a plan view of a combination of a swing body including a suspension arm and a pulley.

The reinforcement fibers F are respectively wound around the feeding bobbins 5 and are in this state carried therein to serve as a subject for the vacuum processing. Preferably as shown in FIG. 2, a weight W is combined with a leading end of each of the reinforcement fibers F. The weight W by gravity guides the reinforcement fiber F through the processor 9 to a space between a corresponding swing body 11 and a corresponding pulley 23.

Referring again to FIG. 1, the feeding rollers 7 are also housed in the first sub-chamber 3a and are, maybe not clearly shown therein, arranged horizontally apart from each other. The horizontal arrangement of them is special to the combination of the corresponding swing bodies 11 and the corresponding pulleys 23. More specifically, the feeding rollers 7 are so disposed that, as the reinforcement fibers F fed out of the feeding bobbins 5 pass through the feeding rollers 7 and are there hung down vertically, the reinforcement fibers F pass through the processor 9 and respectively reach the spaces between the corresponding combinations as shown in FIG. 2. The plurality of combinations of feeding rollers 7, swing bodies 11 and pulleys 23 are so arranged as to keep the plurality of threads of reinforcement fibers F to be parallel but apart from each other in the processor 9. The feeding rollers 7 may be fixed to the first sub-chamber 3a or may be made movable to regulate these positions.

Referring again to FIG. 1, the processor 9 is housed in the main chamber 3b and has a constitution adapted for executing a vacuum processing such as CVD or PVD. In a case where a coating of boron nitride is to be formed for example, the processor 9 can contain tubing for introducing boron fluoride gas, ammonia gas and nitrogen gas as a carrier and a heating furnace. The constitution of the processor 9 has many variations of course and is properly selected therefrom depending on an intended processing. The reinforcement fibers F hung down from the feeding rollers 7 vertically, separated from and in parallel with each other, pass through the processor 9 and are thereby subject to a processing such as coating. The processor 9, in particular the heating furnace thereof, may be formed in a cylindrical shape, or in a polygonal column similar to a cylinder. As the plurality of threads of reinforcement fibers F passes symmetrically about its center or its vicinity, uniform processing on the respective threads is enabled.

Referring to FIG. 2 in combination with FIG. 1, a set of the swing body 11 and the pulley 23 is so arranged in the second sub-chamber 3c as to be horizontally apart from the reinforcement fiber CF drawn by gravity and naturally falling vertically down, and also as to put the reinforcement fiber CF in therebetween when the swing body 11 is at its stand-by position. The same applies to the other combinations. More specifically, the leading end of the reinforcement fiber CF can reach the space between the corresponding swing body 11 and the corresponding pulley 23 generally only by action of gravity without any other means.

Figure 3:
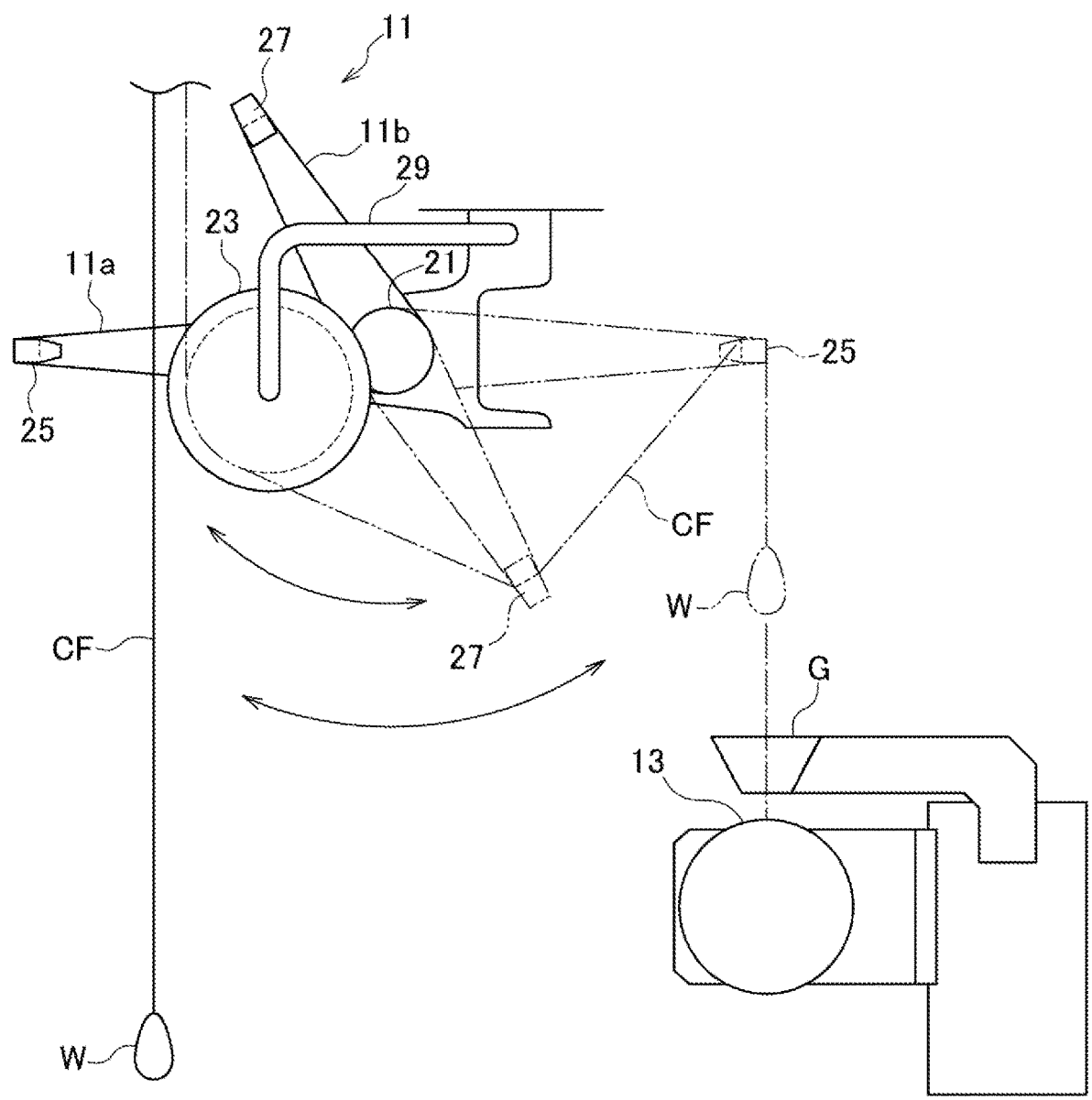
FIG. 3 is a plan view of a set of a swing body and a pulley, showing a view where the suspension arm swings to suspend a reinforcement fiber above a winding bobbin.

Referring further to FIG. 3 in combination with FIG. 2, the vacuum processing device 1 may be provided with rotary shafts 21 so as to pivotally support the swing bodies 11 and may be provided with rotary shafts 29 so as to pivotally support the pulleys 23 and these rotary shafts 21, 29 may be independent. Or, each rotary shaft 29 may be coaxial with each rotary shaft 21 and in this case the pulley 23 rotates as being coaxial with the swing body 11. The rotary shaft 21 may penetrate a wall 3W of the sub-chamber 3c with being gas-tightly sealed by means of a sealing member 33 such as an O-ring for example. Of course, any other sealing means such as magnetic fluid is applicable in place of the O-ring. A driving device such as a motor for driving the swing body 11 may be disposed outside the sub-chamber 3c and thereby the swing body 11 could be driven from the exterior. As the driving device such as the motor, which tends to contaminate the atmosphere, could be disposed outside the chamber 3, this structure is beneficial in executing high-purity vacuum processing.

The rotary shaft 29, from the opposite side to the rotary shaft 21, supports the pulley 23, thereby avoiding interference with the swing motion of the swing body 11. Or, in a case of the coaxial structure, the rotary shaft 29 may be disposed at the same side with the rotary shaft 21. The rotary shaft 29 may also penetrate the wall 3W but instead may be installed inside the sub-chamber 3c as shown in FIG. 2. The rotary shaft 29 may, via a proper linkage 31 such as a gearing or a sprocket, be coupled with the rotary shaft 21 and extract driving force therefrom. The relation between the rotary shafts 21, 29 may be reversed.

The swing body 11 is supported by the rotary shaft 21 and, as being understood from the solid lines and the two-dotted chain lines drawn in FIG. 3, swings about the rotary shaft 21. The swing body 11 is further provided with at least one suspension for arm capturing and suspending the reinforcement fiber CF according to the swing motion thereof. The suspension arm may be provided with a main arm 11a swinging by itself and an auxiliary arm 11b following it to swing.

Each of the arms 11a, 11b may be a cantilever arm extending from the rotary shaft 21 and its distal end may have a structure for capturing the reinforcement fiber CF. The structure at the distal end is, as best shown in FIG. 2, a capturing hook 25, 27 that spreads in a V-letter shape in plan view for example. The distal end of the main arm 11a and the distal end of the auxiliary arm 11b, at these stand-by positions, are positioned to fall apart from but sandwich the reinforcement fiber CF. Particularly the capturing hooks 25, 27 are so directed that insides of the V-letter shape drawn thereby face the reinforcement fiber CF.

The pulley 23 is located inside the trajectory on which the suspension arm swings and in particular its indent is aligned with the trajectory. More specifically, the swing body 11 staying at its initial position, as swinging, gets in contact with the reinforcement fiber CF, as swinging further, guides the reinforcement fiber CF to the pulley, and finally puts it at rest in the indent thereof. The relative positions and angles of the main arm 11a and the auxiliary arm 11b may be so related as to make the capture of the reinforcement fiber CF by the auxiliary arm 11b ahead as compared with that by the main arm 11a, or make them simultaneously. This is beneficial in preventing the reinforcement fiber CF from swinging aside. The pulley 23 may be provided with a guidance device such as a guiding plate to further surely guide the reinforcement fiber CF guided by the swing body 11 to the indent.

The capturing hook or the guiding plate is beneficial in surely capturing the reinforcement fiber CF even if its trajectory slightly changes. In place of, or in addition to, the guiding plate applicable is any structure in any other shape, any induction means such as a magnet that induces the weight W and an electrified body that electrostatically induces the reinforcement fiber CF, or any adhesion or viscous body to which fibers adhere, of course.

The swing body 11 is movable from an initial stand-by position shown by the solid line in FIG. 3, via a position in contact with the reinforcement fiber CF as described above, at least further to a position shown by the two-dotted chain line in FIG. 3. On the other hand, the winding bobbin 13 is arranged to be horizontally apart from the reinforcement fiber CF vertically hung down and substantially just under the distal end of the swung suspension arm. When the swing body 11 is at this position and then the reinforcement fiber CF along with the weight W is hung down above the winding bobbin 13, if the reinforcement fiber CF is lowered down along with the weight W, or the winding bobbin 13 is raised up, the reinforcement fiber CF gets in contact with the winding bobbin 13. Any guiding structure G such as a funnel may be provided just above the winding bobbin 13 in order to guide the weight W to the winding bobbin 13.

Because the swing motion of the swing body 11 can be realized by a rotational motion and the motor can be installed outside the sub chamber 3c by using the shaft penetrating the wall 3W with gas-tight sealing for example as described already, the aforementioned embodiment is beneficial in executing high-purity vacuum processing. In place of actuation by the shaft, of course, any other mechanism such as a hydraulic device is applicable and further the driving device may be installed inside the chamber.

Although each swing body 11 may be given a driving mechanism, the plural swing bodies 11 may be combined together and such a combination may be given a single driving mechanism. The latter structure could not drive the swing bodies 11 independently but is beneficial in reducing the number of elements that cause contamination of the atmosphere.

As will be understood from the above description, each winding bobbin 13 is so arranged at a position where it can take up the reinforcement fiber CF when the swing body 11 swings. While any driving device such as a motor is coupled thereto for its rotation, it can be placed at the exterior of the sub-chamber 3c as a gas-tightly sealed shaft can intermediate the power input. The winding bobbin 13 as being given rotation in advance or in synchronous with the travel of the swing body 11 takes up and winds up the reinforcement fiber CF. Then the weight W may be separated by using a cutter or the reinforcement fiber CF along with the weight W can be wound up. Further a tray may be placed below the winding bobbin 13 in order to receive the weight W there.

Of the reinforcement fiber F that is strained vertically, the upper end is supported by the feeding roller 7 and the lower end is supported by the pulley 23. Thus this combination puts the reinforcement fiber F accurately in place in the processor 9. The sets each consisting of the feeding bobbin 5, the feeding roller 7, the pulley 23 and the winding bobbin 13 may be as shown in FIG. 1 arranged to be vertically apart from each other. These sets are further arranged to be horizontally apart from each other, thereby enabling an arrangement in which the reinforcement fibers CF are arranged to be apart from each other. In a case where the reactor tube wall 3f of the processor 9 is for example cylindrical, the reinforcement fibers CF can be arranged at even intervals around a circle coaxial to the cylinder. Further a reinforcement fiber CF may be additionally arranged at the center of the cylinder and further at even distances to the others. Arrangement at even intervals is beneficial in equalizing the vacuum processing on the respective reinforcement fibers CF.

Figure 4:
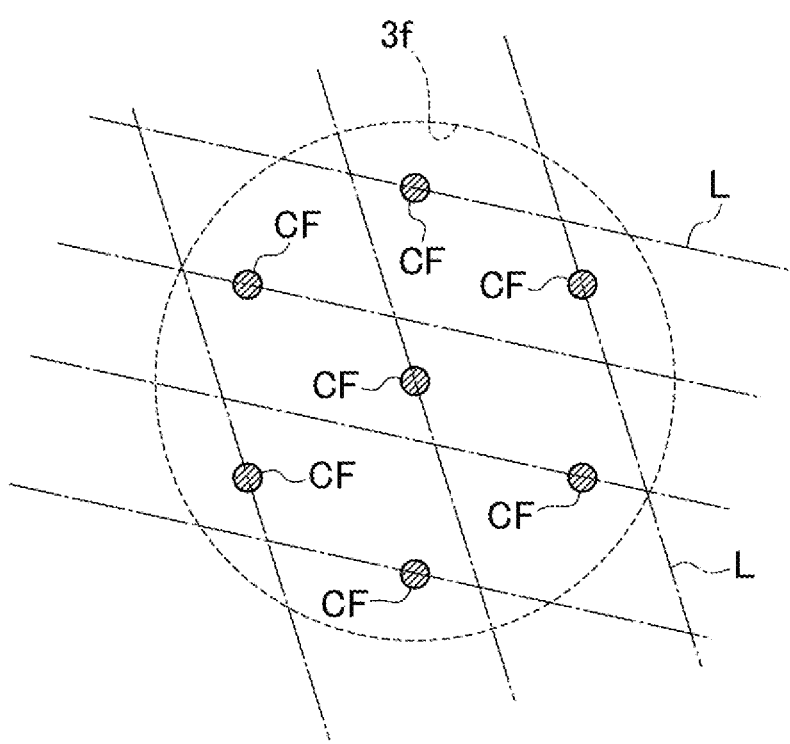
FIG. 4 is a plan view showing an arrangement of plural threads of reinforcement fibers according to an example.

The plurality of swing bodies 11 may also arranged to be vertically apart from each other and further horizontally apart from each other. Such an arrangement prevents the swing bodies 11 from mutually interfering during swinging and also the reinforcement fiber CF from mutually interfering. The reinforcement fibers CF may, as shown in FIG. 4 for example, be arranged at vertexes and a center of a regular hexagon. Four sets of the swing bodies 11 and the pulleys 23 may be then so arranged as to make the trajectories L of the swing bodies 11 parallel with each other and as to be apart from each other in directions distinct from the trajectories L. The remaining three sets may be so arranged as to be similarly apart from each other and make these trajectories L obliquely intersect with the formers. An arrangement such as this prevents the swing bodies 11 from interfering with each other if they make linear motions. This is beneficial in handling a plurality of threads of reinforcement fibers F simultaneously. Of course arrangements of the swing bodies 11 and the pulleys 23 are not limited thereto and the number of sets thereof is not limited to seven but can be more or less. This is beneficial in handling a plurality of threads of reinforcement fibers CF simultaneously.

By closing the gate 17, the main chamber 3b and the second sub-chamber 3c are gas-tightly cut off from each other. Thus the second sub-chamber 3c could be exposed to the atmospheric air with keeping the main chamber 3b evacuated, thereby enabling carry-in and exchange of the winding bobbins 13. The reinforcement fibers CF being processed are taken out in a state where they are wound around the winding bobbins 13.

According to the present embodiment, steps for vacuum processing by CVD or PVD on reinforcement fibers are for example those described below.

Referring to FIG. 1, the interior of the chamber 3 is kept in a depressurized state by vacuum pumps not shown therein. By closing the gates 15, 17, the first and second sub-chambers 3a, 3c are gas-tightly cut off from the main chamber 3b. The outside air is next introduced into the first and second sub-chambers 3a, 3c so that these chambers are exposed to the atmospheric air. The main chamber 3b is even then kept in the depressurized state.

To the first sub-chamber 3a exposed to the atmospheric air, feeding bobbins 5 with reinforcement fibers F wound therearound are respectively introduced. If vacant feeding bobbins 5 are already installed in the first sub-chamber 3a, they are replaced with the formers. The reinforcement fibers F are respectively drawn from the introduced feeding bobbins 5, and made to pass through the tension detectors 19 if installed, and are made to respectively pass through the feeding rollers 7 and hung down therefrom vertically. To the respective leading ends, the weights W are respectively combined.

In parallel, to the second sub-chamber 3c exposed to the atmospheric air, vacant winding bobbins 13 are respectively introduced. If winding bobbins 13 with already processed reinforcement fibers CF wound therearound are installed therein, they are replaced with the formers.

The first and second sub-chambers 3a, 3c are closed and its interior is evacuated by the vacuum pumps not shown in the drawing. When a sufficient degree of vacuum is obtained, the gates 15, 17 are opened and thereby the first sub-chamber 3a, the main chamber 3b and the second sub-chamber 3c are mutually in communication. Then the swing bodies 11 respectively stand by at the positions drawn in the solid lines in FIG. 3.

The plurality of threads of reinforcement fibers F vertically hung down from the feeding rollers 7 passes through the processor 9 disposed in the main chamber 3b. The reinforcement fibers F passing through the processor 9 further fall down vertically and each leading end thereof respectively reaches a space between a corresponding swing body 11 and a corresponding pulley 23. The respective swing bodies 11 are swung to respectively get in contact with the threads and place them into the indents of the pulleys 23. The swing bodies 11 are further swung to render the respective threads in contact with the corresponding winding bobbins 13 and the reinforcement fibers CF are respectively wound up by the winding bobbins 13. In parallel, the main arms 11a may be swung in opposite directions and the respective sub arms 11b may be properly swung, thereby the respective reinforcement fibers CF get detached from the swing bodies 11.

The processor 9 is put into operation so as to execute processing such as coating on the reinforcement fibers F and simultaneously the winding bobbins 13 are started rotating to wind up the processed reinforcement fibers CF at a steady speed.

As will be understood from the above description, when the vacuum processing is finished and then the bobbins needs to be replaced, the first and second sub-chambers need to be exposed to the atmospheric air whereas the main chamber can be kept evacuated. As the main chamber having the largest capacity and the broadest inner area among any parts of the vacuum processing device is kept evacuated, only a short time is needed to obtain a required degree of vacuum after replacing the bobbins. Therefore the vacuum processing can be repeatedly executed with achieving high productivity.

Further according to the present embodiment, the work for connecting the fibers to the bobbins can be carried out under vacuum. Still further according to the present embodiment, a plurality of threads of fibers can be in parallel served for vacuum processing.

In the atmospheric air, if any, the aforementioned work can be manually carried out readily. Or any air nozzle could be used to suck fibers along with the air and then put them in position. More specifically, in the atmospheric air, if any, the work could be automated. The work, however, needs to be carried out in a state where the fibers run through the main chamber and necessarily the main chamber is required to be exposed to the atmospheric air. This is, as reiterated heretofore, extremely damaging to productivity. The manual operation and the nozzle sucking are both impracticable under an evacuated condition.

According to the present embodiment, as the reinforcement fibers are captured and guided to the winding bobbins by the swing bodies, the work is automatically executable even under an evacuated condition. Necessarily the main chamber is not required to be exposed to the atmospheric air and thus high productivity is obtained. Further, by properly arranging the respective elements of the device, a plurality of threads can be simultaneously handled. Higher productivity can be sought.

Although certain embodiments have been described above, modifications and variations of the embodiments described above will occur to those skilled in the art, in light of the above teachings.

INDUSTRIAL APPLICABILITY

A vacuum processing device that enables guiding a plurality of fibers to a plurality of bobbins and starting winding them with keeping a device as a whole in a depressurized state is provided.

What is claimed is:

1. A device of executing vacuum processing on a reinforcement fiber, comprising:
a chamber including a single main chamber executing the vacuum processing and being capable of keeping the chamber as a whole in a depressurized state;
a feeding roller so disposed as to hang down the reinforcement fiber in the main chamber;
a winding bobbin winding the reinforcement fiber, the winding bobbin disposed in the chamber horizontally apart from the reinforcement fiber vertically hung down;
a swing body pivotally supported in the chamber to swing about a pivot and including a suspension arm capable of capturing and suspending the reinforcement fiber according to a swing motion of the swing body, the suspension arm being capable of swinging from a first position horizontally apart from the reinforcement fiber vertically hung down, via a second position for capturing the reinforcement fiber, to a third position to suspend the reinforcement fiber above the winding bobbin; and
a guiding pulley configured to cooperate with the feeding roller to put the reinforcement fiber in place,
wherein the swing body includes an auxiliary arm to follow the suspension arm to swing and the auxiliary arm is so disposed as to capture the reinforcement fiber according to a swinging motion in advance of capturing the reinforcement fiber by the suspension arm and guide the reinforcement fiber to the suspension arm and the guiding pulley.

2. The device of claim 1, wherein the suspension arm includes a capturing hook in a V-letter shape so as to guide the captured reinforcement fiber at the second position toward a center.

3. The device of claim 1, further comprising:
a funnel for capturing the reinforcement fiber hung down above the winding bobbin and guiding the reinforcement fiber to the winding bobbin.

4. The device of claim 1, wherein the swing body includes a rotary shaft led out of the chamber with gas-tight sealing.

5. The device of claim 1, wherein the chamber includes a first sub-chamber housing the feeding roller, and a second sub-chamber housing the winding bobbin and the swing body, and the main chamber is configured to temporarily get gas-tightly separated from the first sub-chamber and the second sub-chamber.

* * * * *